United States Patent [19]

Endoh et al.

[11] Patent Number: 5,596,523
[45] Date of Patent: *Jan. 21, 1997

[54] ELECTRICALLY ERASABLE PROGRAMMABLE READ-ONLY MEMORY WITH AN ARRAY OF ONE-TRANSISTOR MEMORY CELLS

[75] Inventors: Tetsuo Endoh, Yokohama; Riichiro Shirota, Kawasaki, both of Japan

[73] Assignee: Kabushiki Kaisha Toshiba, Kawasaki, Japan

[ * ] Notice: The term of this patent shall not extend beyond the expiration date of Pat. No. 5,355,332.

[21] Appl. No.: 513,000

[22] Filed: Aug. 9, 1995

Related U.S. Application Data

[62] Division of Ser. No. 245,557, May 18, 1994, Pat. No. 5,483,484, which is a continuation of Ser. No. 780,933, Oct. 23, 1991, Pat. No. 5,355,332.

[30] Foreign Application Priority Data

Oct. 23, 1990 [JP] Japan .................... 2-283296

[51] Int. Cl.$^6$ .................................................. G11C 7/00
[52] U.S. Cl. ............... 365/182; 365/185.01; 365/185.28; 365/185.29; 257/314

[56] References Cited

U.S. PATENT DOCUMENTS

| | | | |
|---|---|---|---|
| 5,355,332 | 10/1994 | Endoh et al. | 365/182 |
| 5,406,524 | 4/1995 | Kawamura et al. | 365/226 |
| 5,416,738 | 5/1995 | Shrivastava | 365/185 |
| 5,483,484 | 1/1996 | Endoh et al. | 365/182 |

FOREIGN PATENT DOCUMENTS

| | | |
|---|---|---|
| 62-276878 | 12/1987 | Japan . |
| 63-107069 | 5/1988 | Japan . |

OTHER PUBLICATIONS

IEEE Electron Device Letters, vol. 9, No. 11, Nov. 1988, pp. 588–590, Chi Chang, et al., "Drain–Avalanche and Hole–Trapping Induced Gate Leakage in Thin–Oxide MOS Devices".

IEEE Electron Device Letters, vol. 11, No. 11, Nov. 1990, pp. 514–516, Sameer Haddad, et al., "An Investigation of Erase–Mode Dependent Hole Trapping in Flash EEPROM Memory Cell".

*Primary Examiner*—Viet Q. Nguyen
*Attorney, Agent, or Firm*—Oblon, Spivak, McClelland, Maier & Neustadt, P.C.

[57] ABSTRACT

A floating gate tunneling metal oxide semiconductor transistor is formed on a semiconductive substrate as a cell of electrically erasable programmable read-only memory. The transistor includes a source and a drain spaced apart to define a channel region therebetween in the substrate. An insulated floating gate at least partially overlies the channel region and is capacitively coupled with the substrate. A control gate is insulatively disposed above the conductive layer and spans the channel region. The withstanding voltage of the drain is specifically set to range from a first voltage adapted to be applied to the drain during a read operation to a second voltage applied thereto for forcing the conductive layer to discharge.

15 Claims, 7 Drawing Sheets

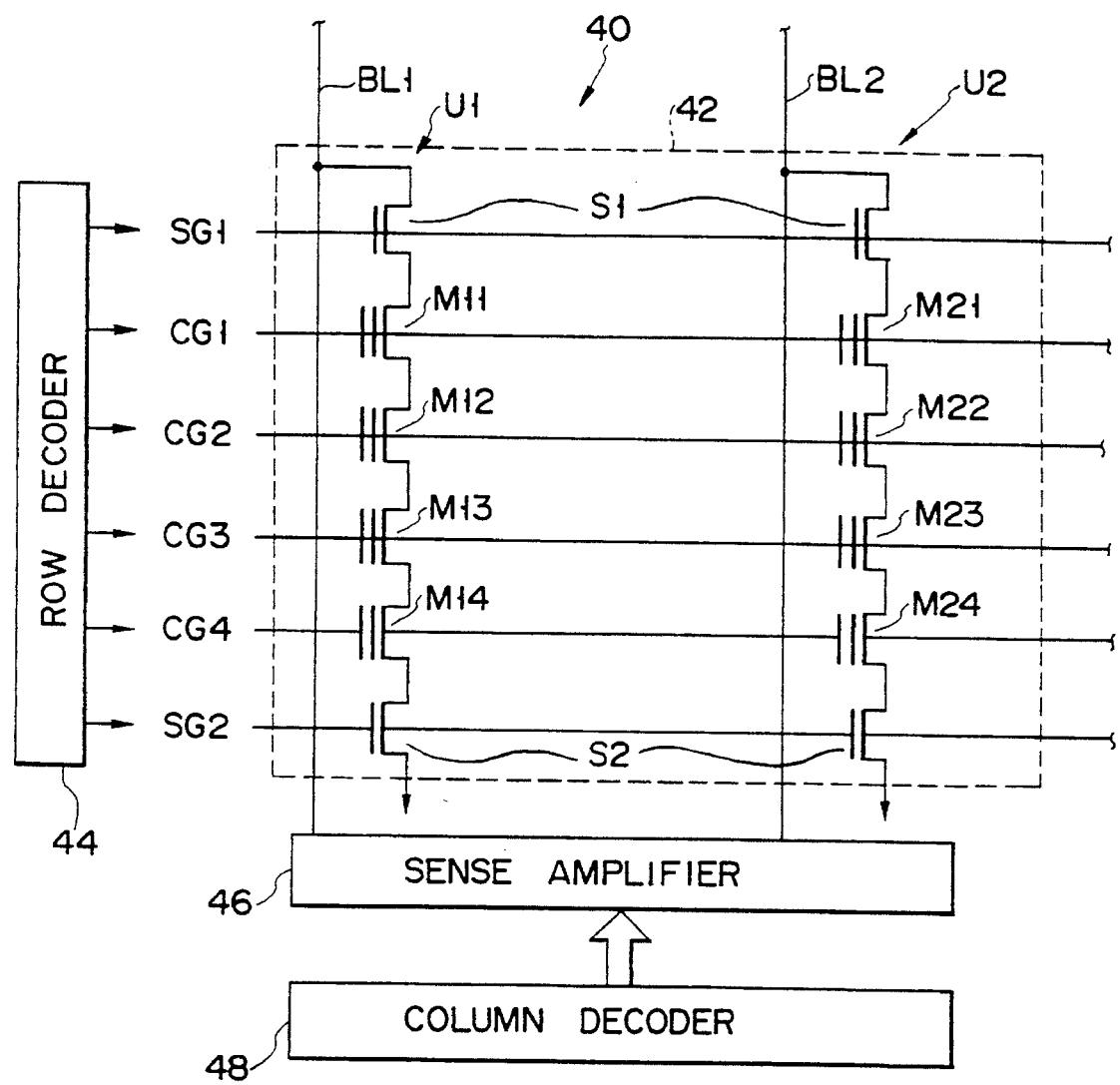
F I G. 6

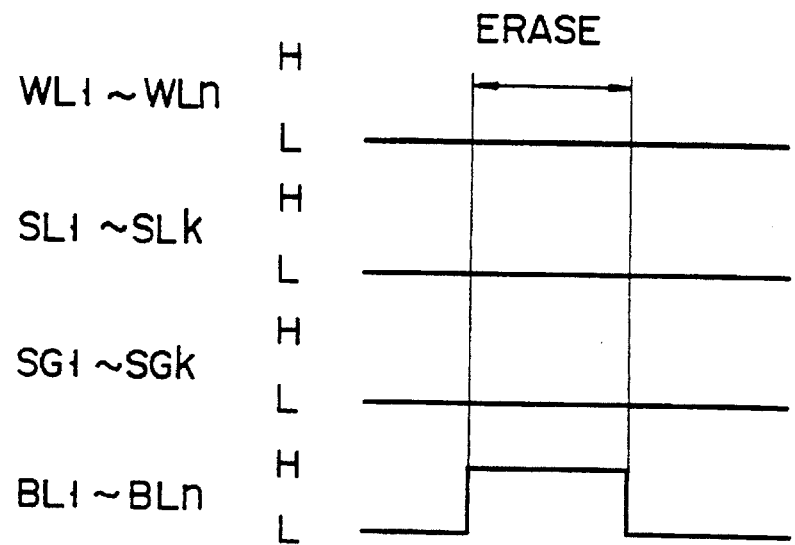
F I G. 9
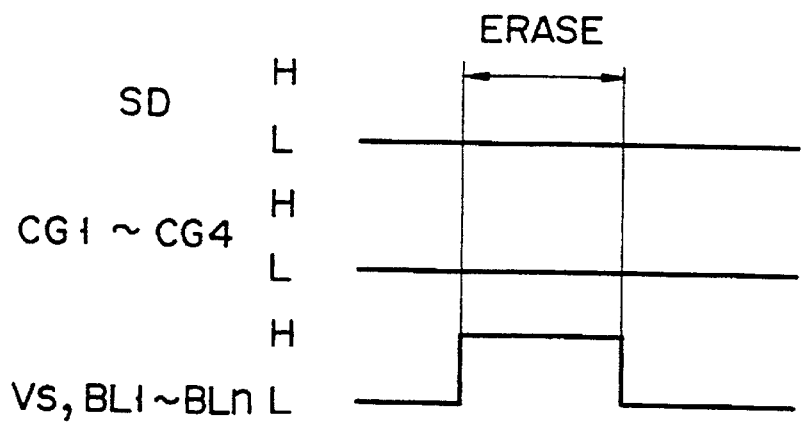
F I G. 11

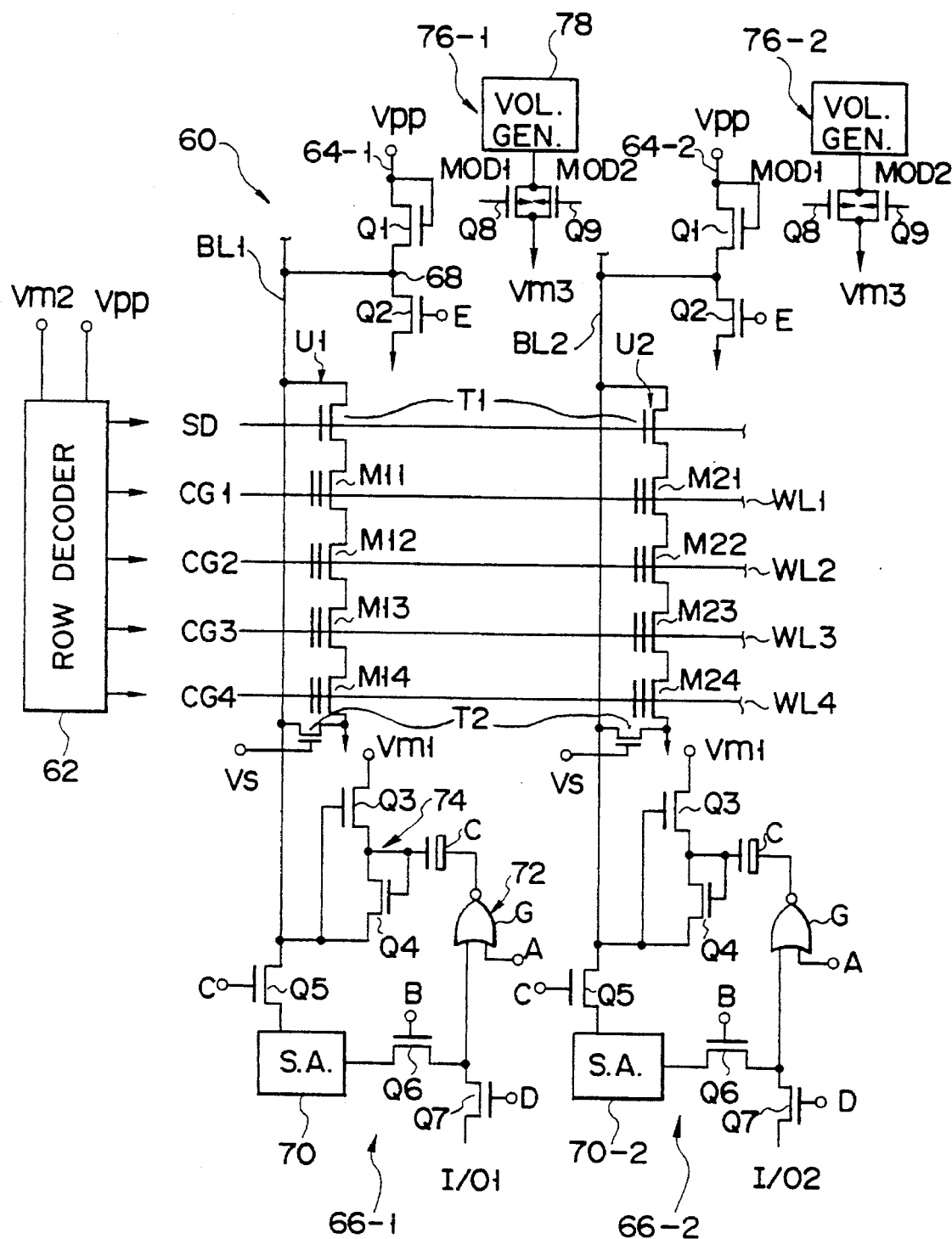
F I G. 10

ELECTRICALLY ERASABLE PROGRAMMABLE READ-ONLY MEMORY WITH AN ARRAY OF ONE-TRANSISTOR MEMORY CELLS

This is a Division of application Ser. No. 08/245,557 filed on May 18, 1994, now U.S. Pat. No. 5,483,484 which is a continuation of Ser. No. 07/780,933 filed on Oct. 23, 1991, now U.S. Pat. No. 5,355,332.

BACKGROUND OF THE INVENTION

1. Field of the Invention

The present invention relates generally to non-volatile semiconductor memories, and more particularly to an electrically erasable and programmable read-only memory (EEPROM) device including an array of memory cells each having a metal-oxide semiconductor (MOS) transistor structure with a charge storage layer and a control gate.

2. Description of the Related Art

Recently, non-volatile semiconductor memory devices have been developed which has an array of memory cells each of which consists of one metal oxide semiconductor (MOS) transistor in order to improve the memory integration density. Each memory cell is a MOS transistor with a twin-gate structure having a floating gate electrode serving as a charge accumulating layer and a control gate electrode that is to be connected to a program line associated therewith. A preselected number of memory cell transistors are connected in series with one another, and are grouped together in a memory cell group. This cell group is connected to a corresponding data transfer line associated therewith. Such cell group is generally called "NAND cell unit." A plurality of NAND cell units are arranged on a chip substrate to obtain a memory cell matrix configuration. With such a non-volatile memory device, the number of transistors required to form the memory cell matrix can be minimized, thereby to achieve the maximum memory integration on the chip substrate of the limited surface area. Due to the technical advantage, the non-volatile semiconductor memory devices of this type keep receiving industrially hot attention.

A NAND cell type EEPROM is one of the most typical non-volatile semiconductor memory devices of the above type. In the memory, each of a plurality of NAND cell units is provided with an insulated gate MOS transistor serving as a select transistor. By causing the select transistor to turn on, the NAND cell unit may be selectively coupled to a corresponding data transfer line associated therewith, which is called the "bit line." To write (program) data into a target memory cell transistor which is selected from among those in the NAND cell unit, proper control voltages are applied to the memory cell transistors of the subject NAND cell unit, causing charge particles (electrons) to tunnel toward the floating gate only in the target cell transistor so that the threshold value of that selected cell transistor is varied. A logic "1" or "0," which is supplied by the bit line associated with the subject NAND cell unit, is selectively programmed in the target memory cell.

An erase operation is performed by applying different kinds of control voltages to the NAND cell unit such that the charge storage state at the floating gate electrode or electrodes becomes opposite to that in the write operation, thereby discharging by tunneling the charge particles from the floating gate electrode to the substrate. Employing this control voltage applying scheme can ensure an electrical erase function selectively or globally among the memory cells in the EEPROM.

Recently, there is a strong demand for a further improvement in the memory integration density even in NAND cell EEPROMs in order to achieve greater storage capacity. Miniaturization of memory cell transistors is pursued positively and continuously at the risk of reducing the operational reliability of NAND cell EEPROMs. The main cause for the shortcoming is undesirable entry of hot holes into the gate insulating film.

More specifically, as the integration density of memory cells becomes higher, the occupation area of each memory cell on the substrate is forced to decrease. Obviously, the gate insulation film lying between the substrate and the floating gate electrode is required to be thinner accordingly. The use of thin gate insulation film of the memory cell transistor will cause the generation of an abnormally high electric field near the drain in an erase operation. Hot holes are thus produced. If such hot holes enter the gate insulation film undesirably, the basic characteristics of the memory cell transistor change physically, causing the cell characteristic to be varied within the NAND cell unit. This causes the operational reliability of the EEPROM to decrease. In the worst case, the device life itself will be shortened seriously.

SUMMARY OF THE INVENTION

It is therefore an object of the present invention to provide a new and improved non-volatile semiconductor memory device with a large memory capacity and an excellent operational reliability.

The transistor of the present invention is useful as a single cell of a novel electrically erasable and programmable semiconductor memory. The transistor is formed on a semiconductive substrate to have a source and a drain spaced apart to define a channel region therebetween in the substrate. An insulated conductive layer at least partially overlies the channel region and is capacitively coupled with the substrate. A control gate is insulatively disposed above the conductive layer and spanning the channel region. The withstanding voltage of the drain is specifically set to range from a first voltage adapted to be applied to said drain during a read operation to a second voltage applied thereto for forcing said conductive layer to discharge.

The foregoing and other objects, features, and advantages of the invention will become apparent from the following more particular description of preferred embodiments of the invention, as illustrated in the accompanying drawings.

BRIEF DESCRIPTION OF THE DRAWINGS

FIG. 6 is a diagram showing the circuit configuration of the main section of the NAND cell EEPROM which includes an array of memory cells arranged in row and columns, each having the memory cell transistor structure shown in FIGS. 1 to 3.

FIG. 9 is an illustration of timing diagram showing the waveforms of voltage signals applied during an erase period to the main parts of a selected cell block in the NAND cell EEPROM of FIG. 8.

FIG. 10 is a circuit diagram showing a NAND cell EEPROM in accordance with another embodiment of the present invention.

FIG. 11 illustrates a timing diagram showing the pulse sequence for the erase operation of the embodiment shown in FIG. 10.

DETAILED DESCRIPTION OF THE PREFERRED EMBODIMENTS

Figure 1:
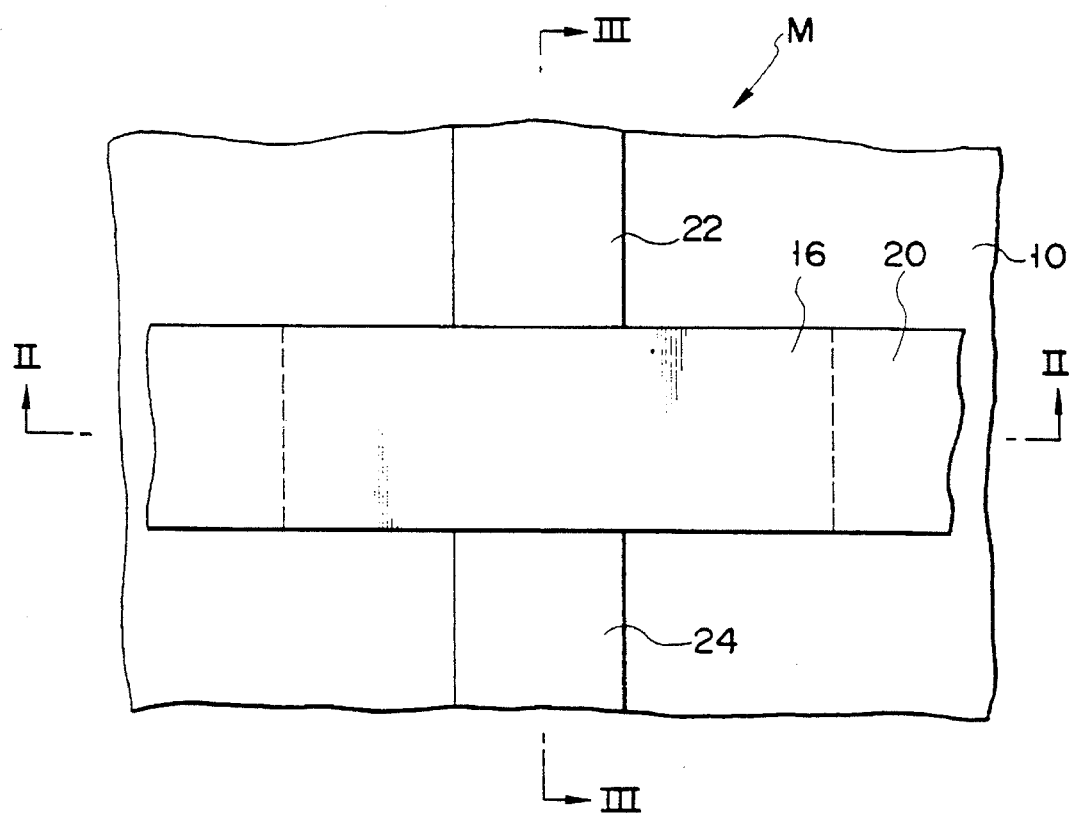
FIG. 1 is a schematic plan view of a memory cell transistor suitable for a NAND cell EEPROM in accordance with an embodiment of the present invention.
Figure 2:
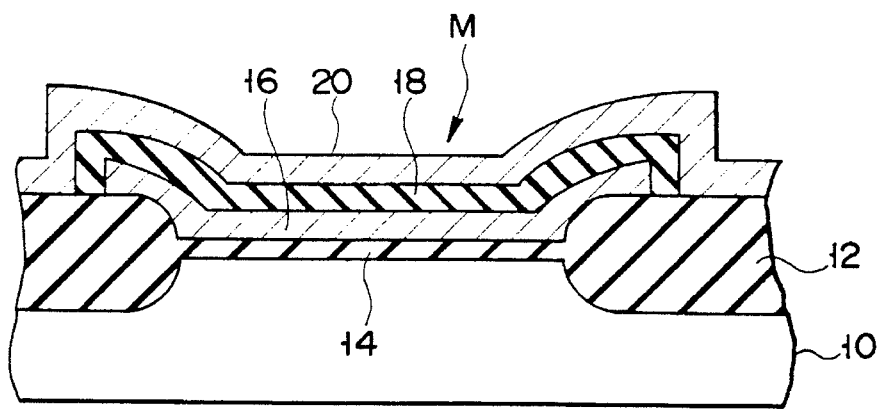
FIG. 2 is a cross-sectional view of the memory cell transistor of FIG. 1 along the line II—II.
Figure 3:
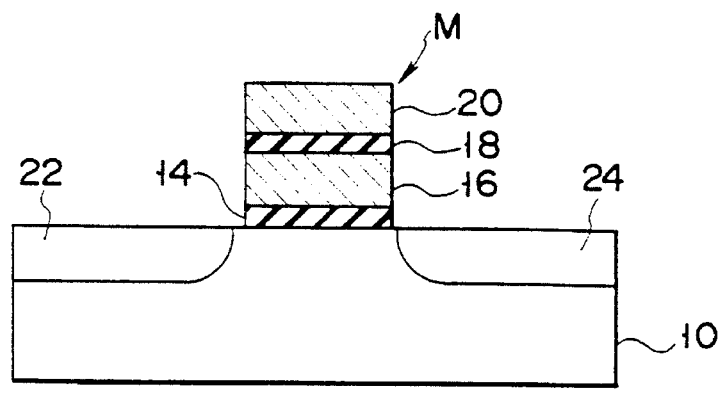
FIG. 3 is a cross-sectional view of the memory cell transistor of FIG. 1 along the line III—III.

Referring to FIG. 1, the plan view of a memory cell transistor employed in a NAND cell EEPROM in accordance with one preferred embodiment of the present invention is generally designated by reference mark "M." Two different cross-sectional structures of the transistor M are illustrated respectively in FIGS. 2 and 3, taken along the lines which perpendicularly cross each other. Principally, this transistor may be a floating-gate tunneling semiconductor field effect transistor.

As shown in FIG. 2, the memory cell transistor M is formed on a silicon substrate. This substrate may be a silicon layer of P-type conductivity. A thick insulative or dielectric layer 12, which is patterned to define therein an element-forming region of a predetermined area, is formed on the top surface of substrate 10. This insulating layer 12 serves as an element-isolation layer. A thin insulative or dielectric film 14 is deposited on the selected top surface of substrate 10 which is surrounded by the element-isolation layer 12. Insulative film 14 is 11 nanometers in thickness, for example, and acts as a first gate insulation film of the memory cell transistor M.

A polycrystalline silicon layer 16 is formed on the first gate insulation film 14. This layer 16 overlies insulative layer 12 at its two opposite end portions thereof as shown in FIG. 2. A second gate insulation film 18 is laminated on layer 16 to cover the same. Another thin polycrystalline silicon layer 20 is stacked on film 18, covering layer 18. Layer 16 serves as a charge-storage layer for transistor M, i.e., a floating gate; the overlying layer 20 functions as a control gate electrode of transistor M. A heavily-doped P-type semiconductor layer(s) is formed beneath element-isolation layer 12 as a channel stopper; it is not visible in FIG. 2.

As shown in FIG. 3, the lamination structure of layers 14, 16, 18, 20 has been subjected to a patterning process to have a constant width along the vertical direction in FIG. 1, i.e., in the direction along the line III—III. P-type substrate 10 is doped with an N-type impurity of $1 \times 10^{15}$ atoms per cubic centimeter by a well-known ion injecting technique, providing two spaced-apart N-type semiconductor layers 22, 24. These layers serve as the source and the drain of memory cell transistor M respectively. Source and drain layers 22, 24 are self-aligned with gate electrodes 16, 20. The distance between layers 22, 24 defines the effective channel length of transistor M. In the present embodiment, the channel length is set short up to on the order of submicrons, for example, about 0.2 micrometer or less, to achieve higher integration.

As apparent from FIG. 1 the control gate electrode 20 extends linearly to be coupled integrally with control gate electrodes of adjacent ones of memory cell transistors (not shown) on substrate 10. Floating gate 16 of transistor M is cut out short beneath control gate 20, and is electrically isolated from all the components of transistor M, i.e., rendered electrically "floating." In other words, floating gate 16 is capacitively coupled with substrate 10 and control gate electrode 20 at different capacitances.

Very importantly, the memory cell transistor M is specifically arranged to satisfy the following two requirements: (1) the withstanding voltage of drain layer 22 is potentially greater than a voltage to be applied to this drain layer 22 in read mode of an EEPROM which employs transistor M as one of its memory cells, when an "L"-level voltage (for example, 0 volts) is applied to substrate 10 and control gate electrode 20; (2) the withstanding voltage of drain 22 is potentially less than a voltage to be applied thereto when electrons are discharged from floating gate 16 to drain layer 22. Such "drain withstanding voltage" arrangement may be easily attained by those skilled in the art without using any special fabrication technique. Typically, the "withstanding voltage" arrangement may be accomplished by performing an impurity-doping process into substrate 10 under the previously described dose condition.

With the specific "drain withstanding voltage" feature, when an "H"-level voltage (for example 20 volts) is applied to drain layer 22 in an erase period, a substrate surface portion between drain 22 and source 24 is then depleted to form a depletion layer therein. In other words, an depletion layer expands through the channel region of memory cell transistor M. A "punch-through" phenomenon thus occurs, causing the source potential to rise positively. The rise of the source potential causes the internal electric field being created near drain 22 of transistor M along the lateral direction thereof to decrease in intensity. It is therefore possible to suppress or inhibit the generation of hot holes, which is an issue in the prior art. This can improve the operational reliability of the EEPROM significantly.

Figure 4A:
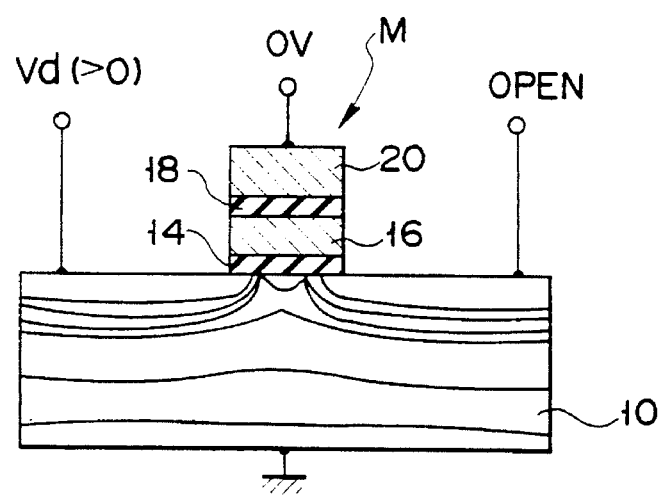
FIGS. 4A and 4B show a diagram showing the potential distribution inside the substrate of the memory cell transistor of the present invention in write mode or erase mode, compared with that of a conventional memory cell transistor.
Figure 4B:
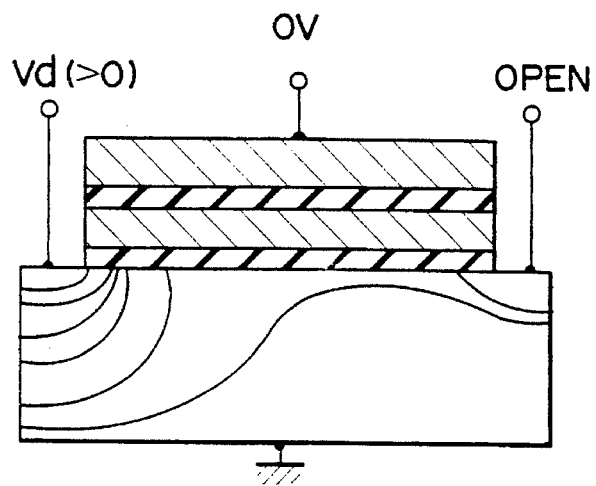

FIG. 4A illustrates a model of the potential distribution inside the substrate 10 of memory cell transistor M under the punch-through phenomenon. This potential distribution is based on the measurements by the present inventors. Each of thin lines is added to represent a curve linking equal potential points. A voltage Vd denotes a positive voltage to be applied to drain 22. The source potential is represented by "OPEN," indicating that the source is potentially isolated from other parts. FIG. 4B shows the potential distribution in the substrate of a conventional memory cell transistor which has a long channel length of 2.0 micrometers, and does not have the above "drain withstanding voltage" feature of the present invention, in the same conditions as in FIG. 4A. As apparent from the comparison between the potential distributions in these diagrams, the potential distribution inside the substrate of transistor M was demonstrated to be well symmetrical with respect to the source and the drain.

Figure 5:
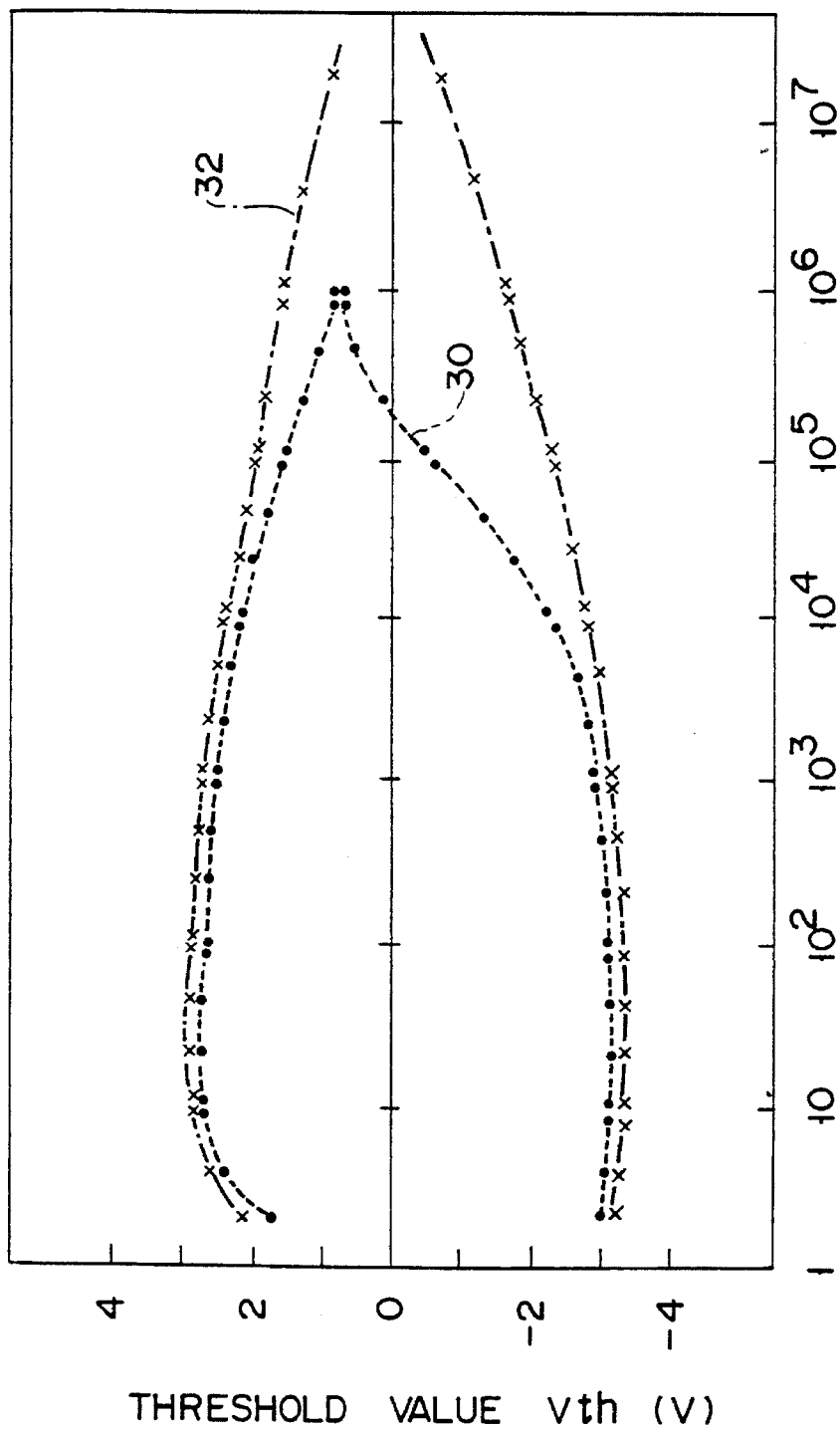
FIG. 5 is a graph showing a measured variation in the threshold value (endurance characteristic) of the memory cell transistor of the present invention, in comparison with that of the conventional memory cell transistor.

Further, the present inventors have measured the endurance characteristic of the memory cell transistor structure according to the present invention and that of the conventional memory cell transistor. The results are shown in FIG. 5. The horizontal scale of the graph in FIG. 5 represents the repeating number of write/erase cycles, while the vertical scale represents the potential threshold value, Vth, of the memory cell transistor. If the fluctuating range of the threshold value Vth is 0.5 volts, conventionally, the characteristic of the threshold value tends to rapidly drop after the write/erase operation is repeated about 105 times, as apparent from a curve 30. In other words, the threshold value tends to change beyond the allowable fluctuating range of 0.5 volts, and never return to the normal condition. The assured repeating number of write/erase cycles remains approximately 105.

In contrast, the EEPROM using the memory cell transistor M of the present invention could operate almost normally even when the write/erase operation was repeated up to about $10^7$ times. In other words, the assured repeating number of the operations was increased by a factor of two digits, compared with the conventional number. These results demonstrate that the endurance characteristic of memory cell transistor M can be significantly enhanced.

Turning now to FIG. 6 there is shown an array of rows and columns of memory cell transistors of a NAND cell type EEPROM 40 employing the above-described transistor structure for each cell. A memory cell block 42 includes a plurality of memory cell units U. Each cell unit Ui (i=1, 2 . . . ) includes a series circuit of a preselected number (four, in this embodiment) of memory cell transistors M, each having the MOS transistor structure previously described referring to FIGS. 1 to 3. For example, the cell unit U1 has memory cell transistors M11, M12, M13 and M14. The number of the memory cell transistors in each unit is not limitative to four; it may be increased to eight, sixteen, and so forth in accordance with the memory capacity as required. In the series-circuit of the memory cell transistors, each active layer 22 (or 24) is commonly shared by two neighboring cell transistors. For example, the layer (24 in FIG. 3) serving as the source of the cell transistor M11 also serves as the drain of the cell transistor M12 neighboring thereto.

As shown in FIG. 6 individual cell unit Ui is provided with two insulated gate MOS transistors S1, S2 at two opposite ends thereof respectively. The first transistor S1 is arranged between cell unit U1 and a corresponding data transfer line (bit line) BLi associated therewith. The second transistors S2 of cell units U are commonly connected to the source potential (e.g. ground potential). Control gate lines CG1, CG2, CG3, CG4 extend to insulatively cross the bit lines BL perpendicularly. Each control gate line CGj (j=1, 2, 3, or 4) is electrically connected to the control gate electrodes of a corresponding row of the memory cells. For instance, control gate line CG2 is associated with memory cell transistors M12, M22, M23, M24. Control gate lines CG may serve as program lines, i.e., word lines in EEPROM 40.

The first transistors S1 in the units U are connected at their gate electrodes to a wiring line SG1. The gate electrodes of the second transistors S2 are connected to another wiring line SG2. These lines SG1, SG2 run in parallel with the word lines CG. Transistors S1, S2 in every cell unit Ui are responsive to the potential change on lines SG1, SG2 to perform a switching operation. In this respect, transistors S1, S2 serve as the "first and second select transistors." Lines SG1, SG2 are called "select gate lines" hereinafter.

A row decoder circuit 44 is connected to word lines CG and select gate lines SG. The circuit 44 may be arranged similarly as in ordinary NAND cell EEPROMs. A sense amplifier circuit 46 is responsive to the column decoder output of a column decoder circuit 48. Any desired cell address among memory cells M can be specified by a combination of the row decoder 44 and column decoder 48. Sense amplifier 46 amplifies a storage data at a selected memory cell being specified.

Figure 7:
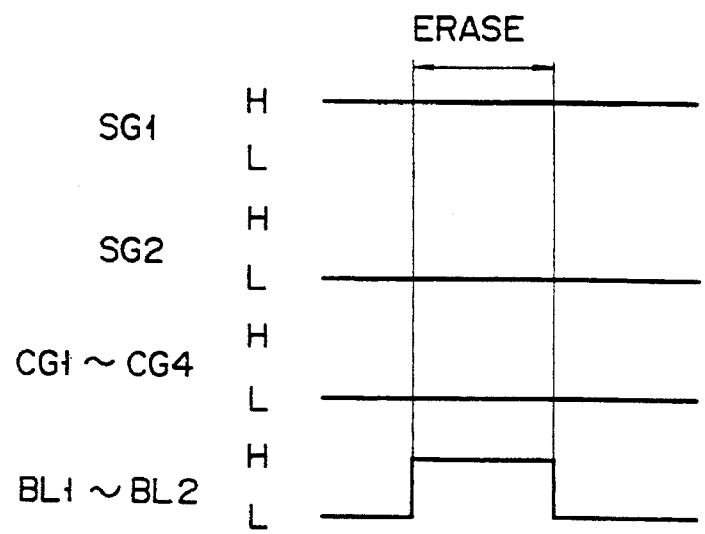
FIG. 7 is an illustration of timing diagram showing the waveforms of voltage signals applied during an erase period to the main parts of a selected cell block in the NAND cell EEPROM of FIG. 6.

To erase data in the memory cell block 42 being selected, voltages as shown in FIG. 7 are applied to the bit lines BL, word lines CG and select gate lines SG. During the erase operation in the selected block, all the lines SG, CG, BL associated with the remaining non-selected memory cell blocks (not shown in FIG. 6) are kept constantly at "L" level voltage. As a result, all the memory cell transistors M in the selected block 42 can be erased at a time, while keeping the memory storage states in the remaining cell blocks (not shown in FIG. 6) unchanged. This is so-called "block erase operation."

More specifically, in the erase mode the first select gate line SG1 is kept at an "H" level potential (e.g., 20 volts), while the second select gate line SG2 is kept at an "L" level potential (e.g., 0 volts). In response to the voltage application, while select transistor S2 is turned off, select transistor S1 is turned on, causing NAND cell units U to be electrically coupled to bit lines BL. Under this condition, all the word lines CG1 through CG4 are set at the "L" level potential in response to the output of row decoder 44. Either "H" or "L" level potential is applied to bit lines BL in response to the output of column decoder 48; "H" level potential is applied thereto when erase is performed. As a result, punch-through occurs simultaneously in every memory cell transistor M in cell block 42, causing all the floating gate electrodes to discharge. This means simultaneous erase of the memory cell transistors M.

During the erase operation, when "L" level potential is applied to first select gate lines associated with the other non-selected cell blocks (not shown in FIG. 6), the above-described erasing would not take place in these blocks for the following reason. In the non-selected blocks all the first select transistors S1 are turned off, so that the potentials appearing on the bit lines BL connected thereto are prevented from being transferred to the NAND cell units in the non-selected blocks.

The advantage of providing the block-erase operation without employing any additional circuits is one of the unexpected results of the above-described "drain withstanding" feature of the present invention. In addition, it can perform a block erase operation of selectively erase only the selected block(s) with the minimum power consumption. The reason for this is that the flow of through-current generated in an erase period can be minimized by forcing first select transistors S1 in non-selected cell blocks to turn off. This would significantly widen the applicability of large-capacity NAND cell EEPROMs.

Figure 8:
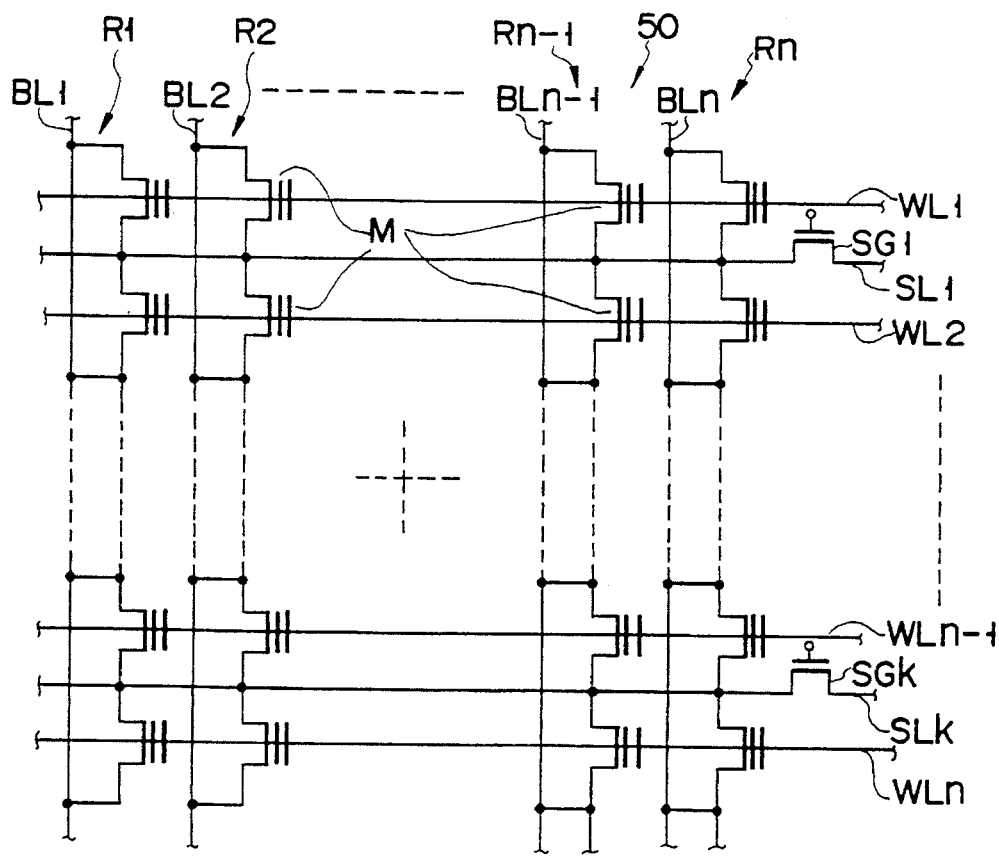
FIG. 8 is a diagram showing the circuit configuration of the main section of the NAND cell EEPROM which includes an array of memory cells arranged in row and columns, each having the memory cell transistor structure shown in FIGS. 1 to 3.

A NOR cell type EEPROM 50 of FIG. 8 in accordance with another embodiment of the present invention includes a memory cell array section which employs the transistor structure previously described with reference to FIGS. 1 to 3 for each of its memory cell transistors. The memory cell array portion includes a plurality of NOR cell units R1, R2, . . . , R(n–1), Rn. Every two neighboring NOR cells in each NOR cell unit Ri are connected to a corresponding bit line BLi at a circuit node at which the drain of one memory cell transistor and the source of the other cell transistor are connected together. The other source and drain of those cell transistors are coupled together to an extra wiring line SL as shown in FIG. 8. Source line SL is provided with a select transistor SG. This transistors may be a known insulated gate MOS transistor. Each of the memory cell transistors M in an individual NOR cell unit Ri is similar to that shown in FIGS. 1 to 3. In a case wherein each unit Ri includes eight memory cell transistors M, four source lines SL1 . . . , SLk are required. Each row of memory cell transistors M are connected to a word line WL at the control gates thereof.

A block erase operation in the NOR cell EEPROM 50 is as follows. As shown in FIG. 9, "L" level potential (0 volts) is applied to the word lines WL1, WL2, . . . , WLn, the gate electrodes of the source select transistors SG1, . . . , SGk, and source lines SL1, . . . , SLk, all being associated with a selected cell block. Also, "H" level potential (e.g., 18 volts) is applied to bit lines BL1, BL2, . . . , BL(n−1), BLn. As a result, punch-through occurs in the memory cell transistors in the selected cell block in a similar manner as in the previously explained embodiment. These memory cell transistors are thus erased simultaneously. As source select transistors SG are forcibly turned off, the flow of through-current can be inhibited in every NOR cell unit Ri. It can thus carry out a block erase operation with the minimal power consumption and the maximized operational reliability. This should contribute to further enhancement of the performance of a so-called "NOR cell type flash EEPROM." Note that the above source select transistors SG may be replaced with a single transistor which is connected in common with source lines SL.

It is also the important feature of EEPROM 50 that during a block erase operation is being performed in a selected memory cell block 42, first and second select gate lines SG1, SG2, control gate (word) lines CG1 to CG4, and bit lines BL associated with the remaining, non-selected memory cell blocks on substrate 10 are forced to remain at the "L" level voltage (0 volts). Such "L" voltage application feature in the non-selected blocks can introduce significant advantage into the NAND cell type EEPROM; it is low power consumption. This may be attained due to the fact that it is no longer required to apply the "H" level voltage to any lines of the non-selected blocks in order to prevent the occurrence of erroneous erase operation therein, unlike as in the presently-available NAND cell type EEPROMs.

Another NAND cell EEPROM 60 is shown in FIG. 10. This embodiment is similar to that of FIG. 6 with the second select transistors S2 being replaced with insulated gate MOS transistors T2, each of which is arranged between the source of the last-stage memory cell transistor M4 and a corresponding bit line BLi associated therewith. Second select transistors T2 have gate electrodes respectively connected to terminal voltage Vs.

As shown in FIG. 10 a row decoder circuit 62 is connected to a first select gate line SD1 and control gate lines CG1 to CG4 (word lines WL1 to WL4). Each bit line BLi is associated with an intermediate voltage generator circuit 64 and a control circuit 66. Intermediate voltage generator 64 is connected to one end of a corresponding bit line BL, while circuit 66 is to the other end thereof. Voltage generator 64 includes a pair of series-connected MOS transistors Q1, Q2 which has a common connection node 68 connected to bit line BLi. Transistor Q1 has a gate electrode connected to its drain, at which a boosted voltage Vpp such as a 10-volt DC voltage is supplied. Transistor Q2 has a gate electrode connected to terminal E.

Each control circuit 66 includes a sense amplifier circuit section 70, a data discriminating circuit section 72, and a write control circuit section 74. These sections may be constituted by using MOS transistors Q3 to Q7, a capacitor C, and a NOR gate G, which are interconnected as shown in FIG. 10. Another intermediate voltage generator circuit 76 is arranged with respect to each bit line BLi. Circuit 76 includes a constant voltage source 78 and a pair of parallel-connected MOS transistors Q8, Q9. These transistors has gate electrodes, which are connected to first and second mode control signals MOD1, MOD2, respectively. The sources of transistors Q8, Q9 are connected together to serve as an output of circuit 76. The circuit arrangement employs three kinds of intermediate voltages: a first intermediate voltage Vm1 that is applied to the drain of transistor Q3 in each control circuit 66, a second voltage Vm2 that is supplied to row decoder 62, and a third voltage Vm3 that is the output of circuit 76.

FIG. 11 is the associated pulsing sequence of the memory cell array shown in FIG. 10. To erase all memory cells M in a selected block at one time, first select gate line SD, gate terminals Vs of second select transistors T2, and bit lines BL are potentially raised at the "H" level (=18 volts), while control gate lines CG (word lines WL) are kept at the "L" level potential such as 0 volts. At this time substrate voltage is also at the "L" level potential. With such a voltage application, block erase can be performed successfully while NAND cell units U1, U2, . . . are connected to bit lines BL by second transistors T2 being forced to turn on in response to voltage Vs.

The present invention is not limited to the above-described specific embodiments and may be practiced or embodied in still other ways without departing from the spirit or essential character thereof.

What is claimed is:

1. An electrically erasable and programmable memory device, comprising:

a semiconductive substrate;

an array of memory cells arranged in rows and columns on said substrate, said array having a plurality of blocks each of which includes a preselected number of subarrays of a plurality of memory cells;

data transfer lines associated with the columns of memory cells;

control lines associated with the row of memory cells;

addressing means for designating a memory address by selecting one from among said data transfer lines and one from among said control lines, respectively; and each of said memory cells essentially consisting of a metal oxide semiconductor transistor having:
a source and a drain spaced apart in said substrate,
an insulated floating carrier-storage layer located above said substrate,
a control gate insulatively disposed above said carrier-storage layer, and
means for causing the withstanding voltage of said drain to range from a first voltage adapted to be applied to said drain during a read operation to a second voltage applied to said drain for forcing said conductive layer to discharge.

2. A device according to claim 1, wherein said drain is doped with an impurity at a specifically selected density which causes the withstanding voltage of said drain to be potentially greater than the first voltage applied to said drain during the read operation and to be less than the second voltage applied to said drain for forcing said carrier-storage layer to discharge.

3. A device according to claim 1, further comprising:

first select means arranged between one end of each of said subarrays of said memory cells and each of said data transfer lines, for selectively turning on to cause said subarrays to be connected with said data transfer lines.

4. A device according to claim 1, further comprising:

second select means coupled between another end of each of said subarrays and a common source voltage, for selectively turning on to cause said subarrays to be connected with the common source voltage.

5. A device according to claim 4, wherein each of said subarrays comprising a series circuit of memory cell transistors, thereby constituting a NAND cell unit.

6. A device according to claim 5, wherein each of said memory cell transistors comprises a floating-gate tunneling semiconductor field effect transistor.

7. A device according to claim 4, wherein each of said subarrays comprises memory cell transistors which are arranged such that a plurality of cells are connected in parallel with one another between a corresponding one of said data transfer lines and a source line, thereby constituting a NOR cell unit.

8. A device according to claim 5, further comprising:

erase means connected to said data transfer lines and said control lines, for erasing a selected block among said blocks by causing punch-through phenomenon to take place in the memory cell transistors in the selected block, while the remaining ones of said blocks are prevented from being erased.

9. A device according to claim 8, wherein said erase means generates a first DC potential and a second DC potential which is higher than the first DC potential, the second DC potential being applied to drain-side nodes of the NAND cell units via said data transfer lines associated therewith.

10. A device according to claim 9, wherein said erase means applies said first DC potential to said control lines.

11. A device according to claim 10, wherein said erase means includes a row decoder circuit which selectively produces said second DC potential.

12. A device according to claim 7, further comprising:

a transistor for selecting said source line.

13. A device according to claim 7, further comprising:

erase means for erasing a selected memory cell transistor by applying a high level voltage to one of said data transfer lines associated with the selected memory cell transistor, while causing a low level voltage to be applied to said substrate, said source line associated with said selected memory cell transistor, a source gate coupled to said source line associated with said selected memory cell transistor, a control gate of said selected memory cell transistor, said data transfer lines associated with non-selected memory cell transistors, source lines associated with the non-selected memory cell transistors, source gates coupled to the source lines associated with the non-selected memory cell transistors, and control gates of said non-selected memory cell transistors.

14. A device according to claim 1, further comprising:

erase means for erasing memory cell transistors of a selected block by applying a high level voltage to said data transfer line associated with said selected block and to first select means associated with said selected block, while causing a low level voltage to be applied to (i) second select means associated with said select block, (ii) the control gates of the memory cell transistors of said selected block, and (iii) data transfer lines and said first and second select means associated with non-selected blocks, (iv) the control gates of the memory cell transistors of said non-selected blocks, and (v) sources of said selected and non-selected blocks and said substrate.

15. A device according to claim 5, further comprising:

erase means for erasing memory cell transistors of a selected block by applying a high level voltage to said data transfer line associated with said selected block and to first select means associated with said selected block, while causing a low level voltage to be applied to (i) second select means associated with said selected block (ii) the control gates of the memory cell transistors of said selected block, and (iii) data transfer lines and said first and second select means associated with non-selected blocks, (iv) the control gates of the memory cell transistors of said non-selected blocks, and (v) sources of said selected and non-selected blocks and said substrate.

* * * * *